(12) United States Patent
Gong et al.

(10) Patent No.: US 10,644,075 B2
(45) Date of Patent: May 5, 2020

(54) LIGHT-EMITTING DISPLAY DEVICE

(71) Applicant: LG DISPLAY CO., LTD., Seoul (KR)

(72) Inventors: Hyejin Gong, Paju-si (KR); Joonyoung Heo, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 17 days.

(21) Appl. No.: 16/019,339

(22) Filed: Jun. 26, 2018

(65) Prior Publication Data

US 2019/0006436 A1 Jan. 3, 2019

(30) Foreign Application Priority Data

Jun. 30, 2017 (KR) ........................ 10-2017-0083858

(51) Int. Cl.
| | |
|---|---|
| *H01L 27/32* | (2006.01) |
| *H01L 51/52* | (2006.01) |
| *H01L 51/50* | (2006.01) |
| *G09G 3/3258* | (2016.01) |
| *H01L 51/56* | (2006.01) |
| *G09G 3/3291* | (2016.01) |
| *G09G 3/3266* | (2016.01) |
| *G09G 3/3233* | (2016.01) |

(52) U.S. Cl.
CPC ....... *H01L 27/3213* (2013.01); *G09G 3/3233* (2013.01); *G09G 3/3258* (2013.01); *G09G 3/3266* (2013.01); *G09G 3/3291* (2013.01); *H01L 27/3246* (2013.01); *H01L 27/3258* (2013.01); *H01L 27/3262* (2013.01); *H01L 27/3265* (2013.01); *H01L 51/5036* (2013.01); *H01L 51/5218* (2013.01); *H01L 51/5237* (2013.01); *H01L 51/56* (2013.01); *G09G 2300/0452* (2013.01); *G09G 2310/0251* (2013.01); *G09G 2330/12* (2013.01)

(58) Field of Classification Search
CPC ............ H01L 27/3213; H01L 27/3246; H01L 27/3258; H01L 27/3262; H01L 27/3265; H01L 51/5036; H01L 51/5218; H01L 51/5237; H01L 51/56; G09G 3/3233; G09G 3/3258; G09G 3/3266; G09G 3/3291; G09G 2300/0452; G09G 2310/0251; G09G 2330/12
See application file for complete search history.

(56) References Cited

U.S. PATENT DOCUMENTS

| | | | | |
|---|---|---|---|---|
| 9,601,550 | B2* | 3/2017 | Seo | ............ H01L 51/0015 |
| 9,680,122 | B1* | 6/2017 | Seo | ............ H01L 51/0015 |
| 9,923,170 | B2* | 3/2018 | Kim | ............ H01L 51/5259 |
| 2013/0161656 | A1* | 6/2013 | Choi | ............ H01L 51/5253 |
| | | | | 257/88 |

(Continued)

FOREIGN PATENT DOCUMENTS

KR 20160072010 A 6/2016

*Primary Examiner* — Peter D McLoone
(74) *Attorney, Agent, or Firm* — Seed IP Law Group LLP

(57) ABSTRACT

The present disclosure provides a light-emitting display device including a first substrate, sub-pixels and contact holes. Each sub-pixel is positioned on the first substrate and has an emission area from which light is emitted. The contact is positioned in a hole in the emission area and serves to electrically connect a transistor of the sub-pixel to a light-emitting diode emitting light and an emission layer on the contact is to emit light in the same color as the light emitted from the emission area.

14 Claims, 19 Drawing Sheets

(56) References Cited

U.S. PATENT DOCUMENTS

| | | | |
|---|---|---|---|
| 2014/0353643 A1* | 12/2014 | Seo | H01L 51/0015 257/40 |
| 2017/0098690 A1* | 4/2017 | Lee | H01L 51/5275 |
| 2017/0149010 A1* | 5/2017 | Seo | H01L 51/0015 |
| 2017/0186823 A1* | 6/2017 | Kim | H01L 27/3213 |
| 2018/0174508 A1* | 6/2018 | Jeong | H01L 51/0096 |
| 2018/0315806 A1* | 11/2018 | Lee | H01L 27/3246 |
| 2019/0221778 A1* | 7/2019 | Kim | H01L 27/3216 |

* cited by examiner (a)

(b)

(a)

(b)

(c)

(d)

LIGHT-EMITTING DISPLAY DEVICE

CROSS-REFERENCE TO RELATED APPLICATION

This application claims the benefit of Korean Patent Application No. 10-2017-0083858, filed Jun. 30, 2017, which is incorporated herein by reference for all purposes as if fully set forth herein.

BACKGROUND

Technical Field

The present disclosure relates to a light-emitting display device.

Description of the Related Art

With the development of information technology, markets for display devices which are connection media between users and information are growing. Accordingly, various types of display devices such as a light-emitting display, a liquid crystal display and a plasma display panel are increasingly used.

A display device includes a display panel having a plurality of sub-pixels, a driver for driving the display panel, and a power supply for supplying power to the display panel. The driver includes a scan driver for supplying a scan signal (or gate signal) to the display panel and a data driver for supplying a data signal to the display panel.

Among the aforementioned display devices, the light-emitting display device can display images in such a manner that light-emitting diodes of selected sub-pixels emit light when scan signals and data signals are supplied to sub-pixels. A light-emitting diode is formed using an organic material or an inorganic material. However, it is necessary to increase aperture ratios of conventional light-emitting display devices in order to achieve high definition.

BRIEF SUMMARY

The present disclosure provides a light-emitting display device including a first substrate, sub-pixels and contacts that are positioned in contact holes. Each sub-pixel is positioned on the first substrate and has an emission area from which light is emitted. The contact is positioned in the emission area and serves to electrically connect a transistor of the sub-pixel to a light-emitting diode emitting light and an emission layer on the contact is to emit light in the same color as the light emitted from the emission area.

BRIEF DESCRIPTION OF THE SEVERAL VIEWS OF THE DRAWINGS

The accompany drawings, which are included to provide a further understanding of the disclosure and are incorporated on and constitute a part of this specification illustrate embodiments of the disclosure and together with the description serve to explain the principles of the disclosure.

DETAILED DESCRIPTION

Reference will now be made in detail embodiments of the disclosure examples of which are illustrated in the accompanying drawings.

A light-emitting display device described below may be realized as a TV, a video player, a personal computer (PC), a home theater, a smartphone, a virtual reality (VR) device, etc. In addition, the light-emitting display device described below may be an organic light-emitting display device configured on the basis of an organic light-emitting diode (light-emitting element). However, the light-emitting display device described below may be configured on the basis of an inorganic light-emitting diode.

Furthermore, electrodes of a thin film transistor of the light-emitting display device described below, other than a gate electrode, may be called a source electrode and a drain electrode or a drain electrode and a source electrode. However, the electrodes will be described as a first electrode and a second electrode.

Figure 1:
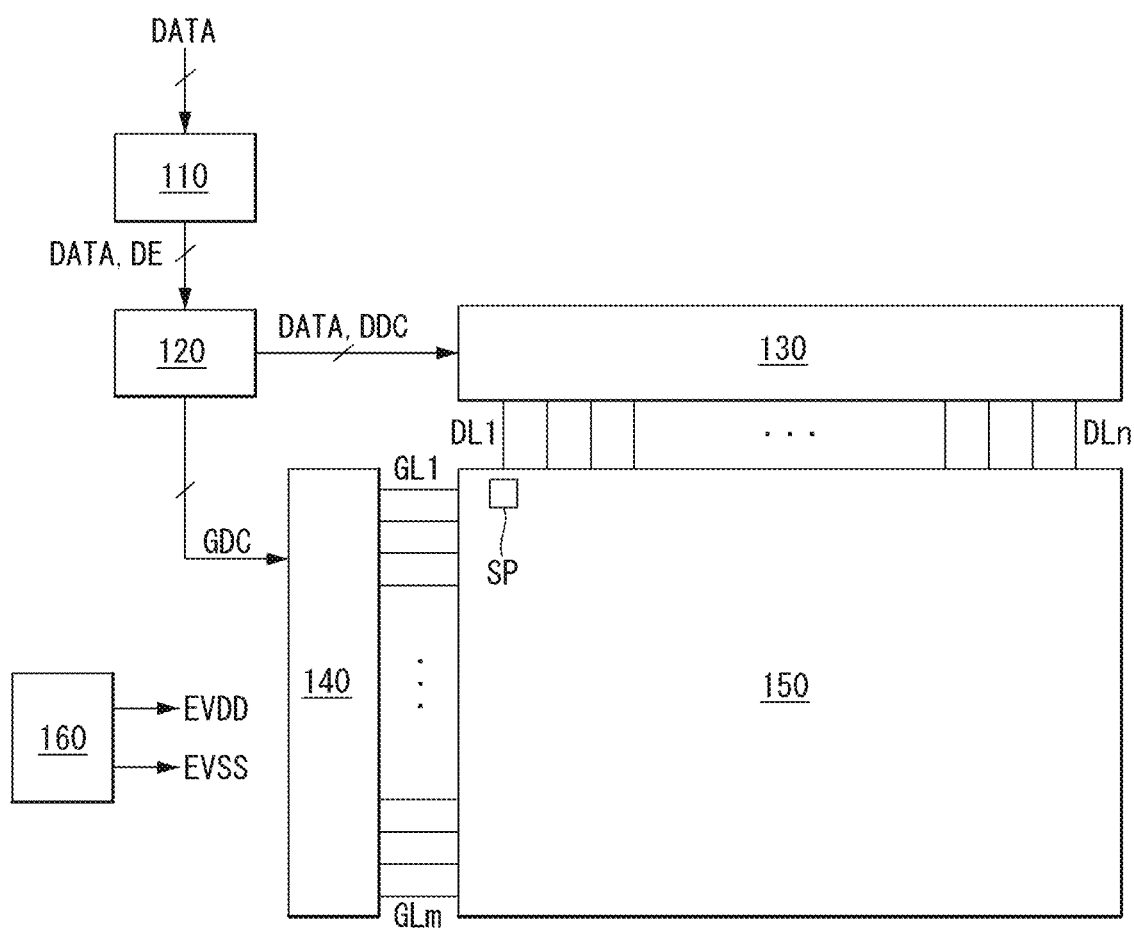
FIG. 1 is a schematic block diagram of an organic light-emitting display device.
Figure 2:
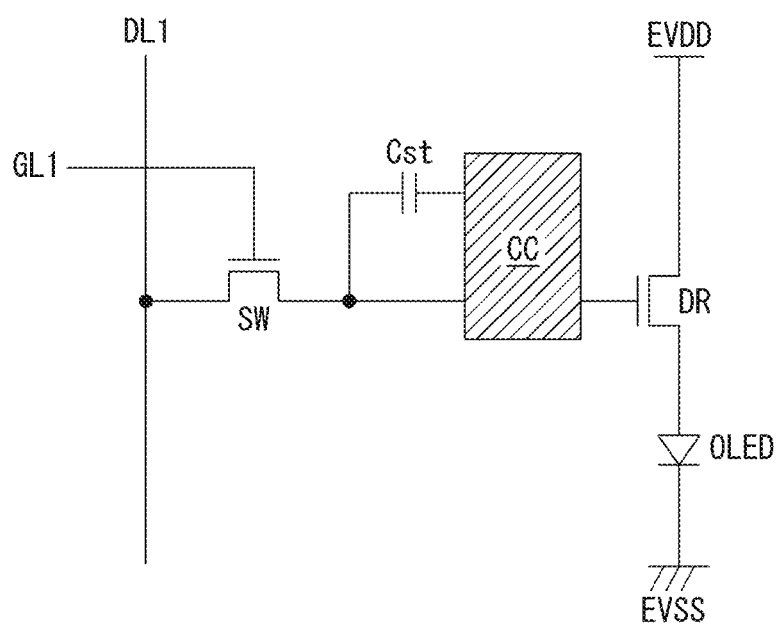
FIG. 2 is a schematic circuit diagram of a sub-pixel.
Figure 3:
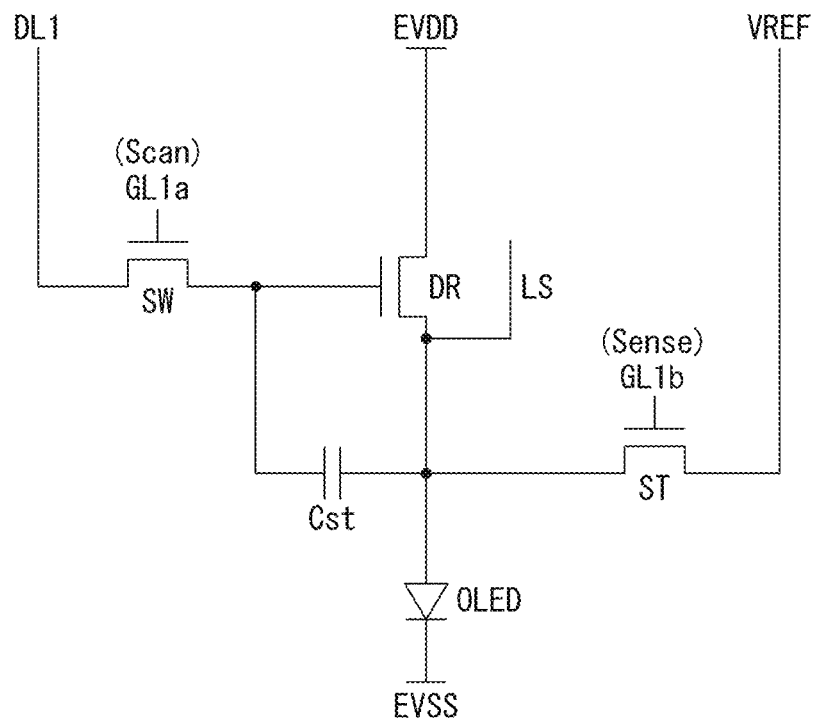
FIG. 3 is a detailed circuit diagram of the sub-pixel.

FIG. 1 is a schematic block diagram of an organic light-emitting display device, FIG. 2 is a schematic circuit diagram of a sub-pixel and FIG. 3 is a detailed circuit diagram of the sub-pixel.

As shown in FIG. 1, the organic light-emitting display device includes an image processor 110, a timing controller 120, a data driver 130, a scan driver 140, a display panel 150 and a power supply 160.

The image processor 110 outputs an externally supplied data signal DATA and a data enable signal DE. Although the image processor 110 may output one or more of a vertical synchronization signal, a horizontal synchronization signal and a clock signal in addition to the data enable signal DE, illustration of these signals is omitted for convenience of description.

The timing controller 120 receives the data signal DATA along with the data enable signal DE or driving signals including the vertical synchronization signal, the horizontal synchronization signal, the clock signal and the like from the image processor 110. The timing controller 120 outputs a gate timing control signal GDC for controlling operation timing of the scan driver 140 and a data timing control signal DDC for controlling operation timing of the data driver 130 on the basis of the driving signals.

The data driver 130 samples and latches the data signal DATA supplied from the timing controller 120, converts the data signal DATA into a gamma reference voltage and outputs the gamma reference voltage in response to the data timing control signal DDC supplied from the timing controller 120. The data driver 130 outputs the data signal DATA through data lines DL1 to DLn. The data driver 130 may be formed in the form of an integrated circuit (IC).

The scan driver 140 outputs a scan signal in response to the gate timing control signal GDC supplied from the timing controller 120. The scan driver 140 outputs the scan signal through scan lines GL1 to GLm. The scan driver 140 is formed in the form of an IC or configured in the form of gate-in-panel in the display panel 150.

The power supply 160 outputs a high voltage and a low voltage. The high voltage and the low voltage output from the power supply 160 are supplied to the display panel 150. The high voltage is supplied to the display panel 150 through a first power light EVDD and the low voltage is supplied to the display panel 150 through a second power line EVSS.

The display panel 150 displays an image in response to the data signal DATA and the scan signal supplied from the data driver 130 and the scan driver 140 and the power supplied from the power supply 160. The display panel 150 includes sub-pixels SP operating to display images.

The sub-pixels SP include red, green and blue sub-pixels or white, red, green and blue sub-pixels. The sub-pixels SP may have one or more emission areas according to emission characteristics.

As shown in FIG. 2, a single sub-pixels includes a switching transistor SW, a driving transistor DR, a capacitor Cst, a compensation circuit CC and an organic light-emitting diode OLED.

The switching transistor SW performs a switching operation such that a data signal supplied through the first data line DL1 is stored as a data voltage in the capacitor Cst in response to a scan signal supplied through the first scan line GL1. The driving transistor DR operates such that a driving current flows between the first power line EVDD (high voltage) and the second power line (low voltage) according to the data voltage stored in the capacitor Cst. The organic light-emitting diode OLED serves to emit light according to the driving current generated by the driving transistor DR.

The compensation circuit CC is a circuit added to the sub-pixel in order to compensate for a threshold voltage of the driving transistor DR. The compensation circuit CC is composed of one or more transistors. The compensation circuit CC is configured in various manners according to compensation methods. An example of the compensation circuit CC will be described.

As shown in FIG. 3, the compensation circuit CC includes a sensing transistor ST and a reference line VREF (or sensing line). The sensing transistor ST is connected between the source electrode of the driving transistor DR and an anode of the organic light-emitting diode OLED (to a sensing node). The sensing transistor ST serves to supply an initialization voltage (or sensing voltage) delivered through the reference line VREF to the sensing node of the driving transistor DR or to sense a voltage or current of the sensing node of the driving transistor DR or the reference line VREF.

The switching transistor SW has a first electrode connected to the first data line DL1 and a second electrode connected to the gate electrode of the driving transistor DR. The driving transistor DR has a first electrode connected to the first power line EVDD and a second electrode connected to the anode of the organic light-emitting diode OLED. The capacitor Cst has a first electrode connected to the gate electrode of the driving transistor DR and a second electrode connected to the anode of the organic light-emitting diode OLED. The anode of the organic light-emitting diode OLED is connected to the second electrode of the driving transistor DR and the cathode thereof is connected to the second power line EVSS. The sensing transistor ST has a first electrode connected to the reference line VREF and a second electrode connected to the anode of the organic light-emitting diode OLED and the second electrode of the driving transistor DR.

Operation time of the sensing transistor ST may be similar to or different from that of the switching transistor SW according to an external compensation algorithm (or compensation circuit configuration). For example, a scan line GL1a connected to the gate electrode of the switching transistor SW and a scan line GL1b connected to the gate electrode of the sensing transistor ST may be connected to be commonly shared. Alternatively, the gate electrode of the switching transistor SW may be connected to the scan line GL1a and the gate electrode of the sensing transistor ST may be connected to the scan line GL1b. In this case, the scan line GL1a and the scan line GL1b are separated from each other to deliver different scan lines.

The reference line VREF may be connected to the data driver. In this case, the data driver can sense the sensing node of the sub-pixel to produce a sensing result for a non-display period or N frames (N being an integer equal to or greater than 1). Meanwhile, the switching transistor SW and the sensing transistor ST may be simultaneously turned on. In this case, a sensing operation through the reference line VREF and a data output operation for outputting a data signal are separated from each other according to time division operation of the data driver.

In addition, a digital data signal, an analog data signal, gamma or the like may be a compensation target according to the sensing result. The compensation circuit for generating a compensation signal (or compensation voltage) on the basis of the sensing result may be provided in the data driver or the timing controller or may be implemented as a separate circuit.

The light-shielding layer LS may be disposed only under the channel region of the driving transistor DR or may be disposed under the channel regions of the switching transistor SW and the sensing transistor ST as well as the channel region of the driving transistor DR. The light-shielding layer LS may be used to shield external light or may be used as an electrode which is connected to other electrodes or lines and constitutes a capacitor. Accordingly, multiple metal layers (multiple layers of heterogeneous metals) are selected as the light-shielding layer LS such that the light-shielding layer LS has light-shielding characteristics.

Although a 3T1C (3 transistors and 1 capacitor) sub-pixel structure including the switching transistor SW, the driving transistor DR, the capacitor Cst, the organic light-emitting diode OLED and the sensing transistor ST has been described as an example in FIG. 3, 3T2C, 4T2C, 5T1C and 6T2C structures may be employed when the compensation circuit CC is added.

Figure 4:
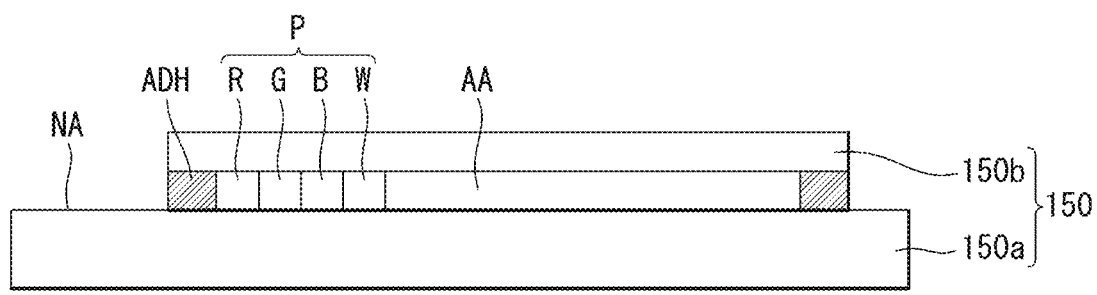
FIG. 4 is a diagram schematically illustrating a cross section of a display panel.
Figure 5:
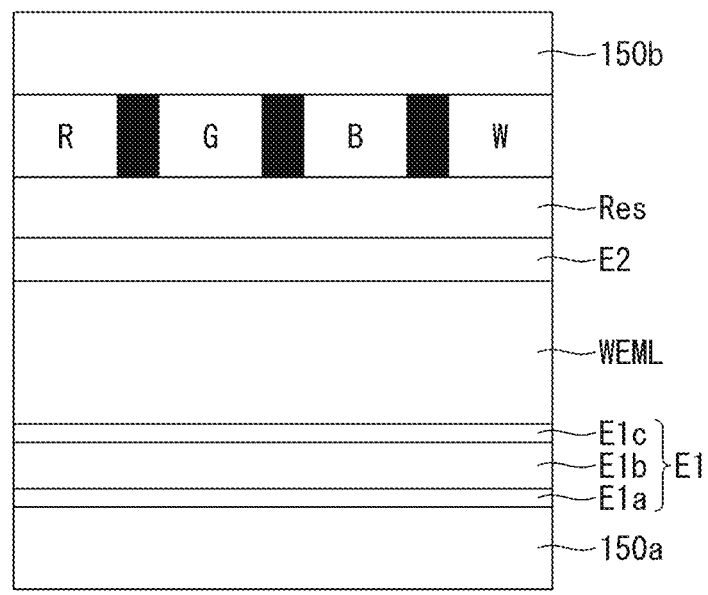
FIG. 5 is a diagram illustrating a cross section of sub-pixels shown in FIG. 4 in more detail.

FIG. 4 is a diagram schematically illustrating a cross section of the display panel and FIG. 5 is a diagram illustrating a section of sub-pixels shown in FIG. 4 in more detail.

As shown in FIG. 4, sub-pixels are formed on a display area AA of a first substrate (or thin film transistor substrate) 150a on the basis of the circuits described with reference to FIG. 3. The sub-pixels of the first substrate 150a are sealed using a second substrate (protection substrate or protection film) 150b and an adhesive member ADH. NA represents a non-display area. The first substrate 150a and the second substrate 150b may be formed of a flexible material such as glass or resin.

The sub-pixels are arranged in the order of red R, green G, blue B and white W in the horizontal or vertical direction on the display area AA. Sub-pixel arrangement order may vary according to an emission material, an emission area, compensation circuit configuration (or structure) and the like. A single pixel is defined as red, green, blue and white sub-pixels, R, G, B and W or defined as red, green and blue sub-pixels R, G and B.

The color of light emitted from a sub-pixel is determined in response to a material of an emission layer positioned between two electrodes or a material of a color filter that changes light emitted from the emission layer. That is, a color can be expressed by the emission layer or on the basis of the emission layer and the color filter. Color determination depending on the material of the color filter will be described below.

As shown in FIG. 5, red, green, blue and white sub-pixels may include a white light-emitting diode and color filters R, G, B and W. The white light-emitting diode is formed on one side of the first substrate 150a and includes a lower electrode E1, a white emission layer WEML and an upper electrode E2. The color filters R, G, B and W may be formed on one side of the second substrate 150b, which faces the white light-emitting diode, or the white light-emitting diode. A resin layer Res may be positioned between the upper electrode E2 and the color filters R, G, B and W. However, the resin layer Res may be omitted according to sealing structure.

The lower electrode E1 may be composed of a first lower electrode E1a, a second lower electrode E1b and a third lower electrode E1c in order to improve light emission characteristics in the direction of the second substrate 150b. The first lower electrode E1a may be formed of a transparent metal material (e.g., ITO), the second lower electrode E1b may be formed of a reflective metal material (e.g., Ag) and the third lower electrode E1c may be formed of a transparent metal material (e.g., ITO). However, the structure of the lower electrode E1 is not limited thereto.

The above-described organic light-emitting display device needs to improve the aperture ratio thereof in order to achieve high definition. The present disclosure studies models of experimental examples and proposes embodiments for further improving the aperture ratio of sub-pixels compared to the experimental examples in order to increase the aperture ratio of sub-pixels.

EXPERIMENTAL EXAMPLE

Figure 6:
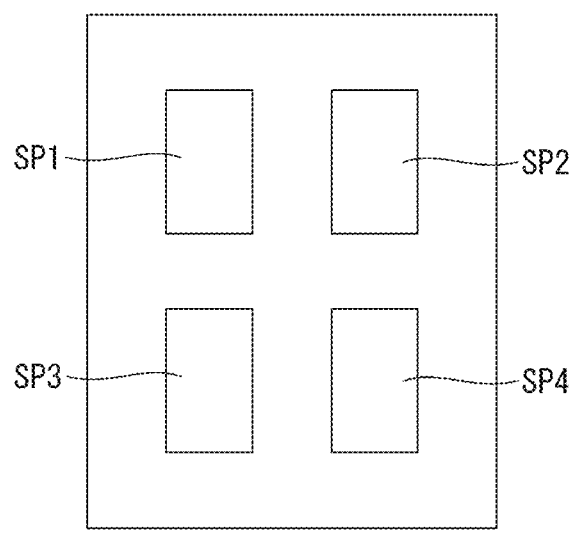
FIG. 6 is a diagram schematically showing a layout of sub-pixels according to an experimental example.
Figure 7:
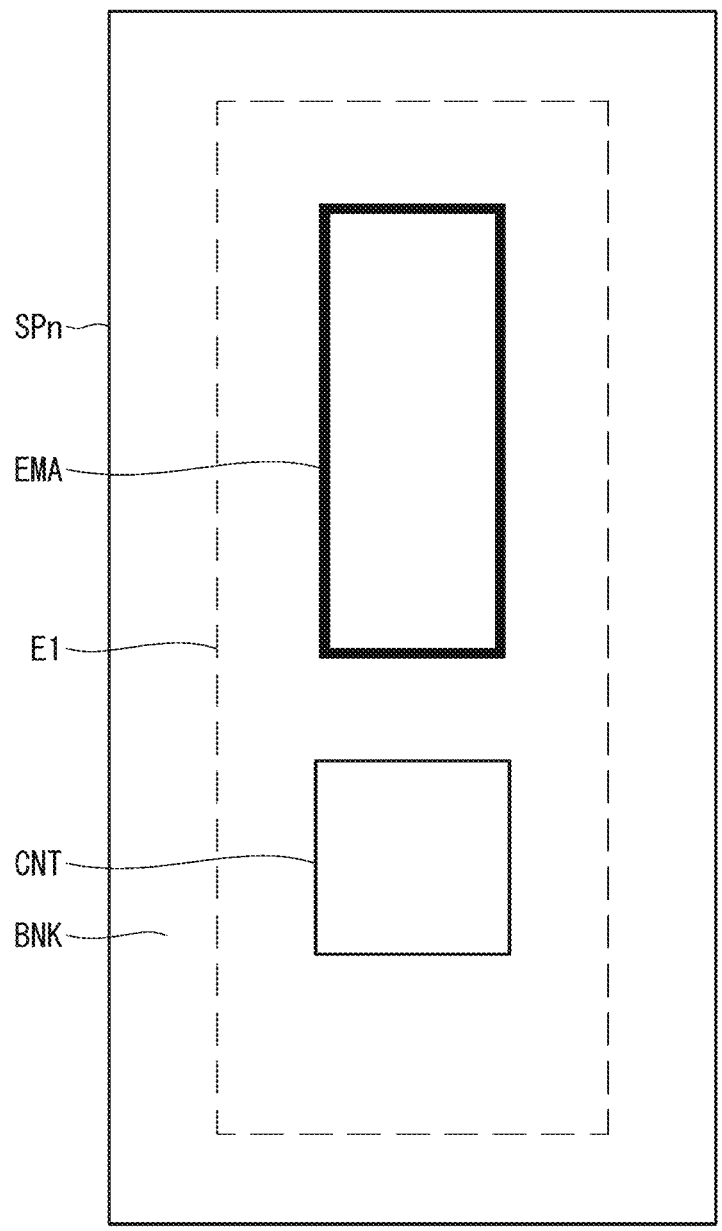
FIG. 7 is a diagram showing a plane of a sub-pixel according to an experimental example in more detail.
Figure 8:
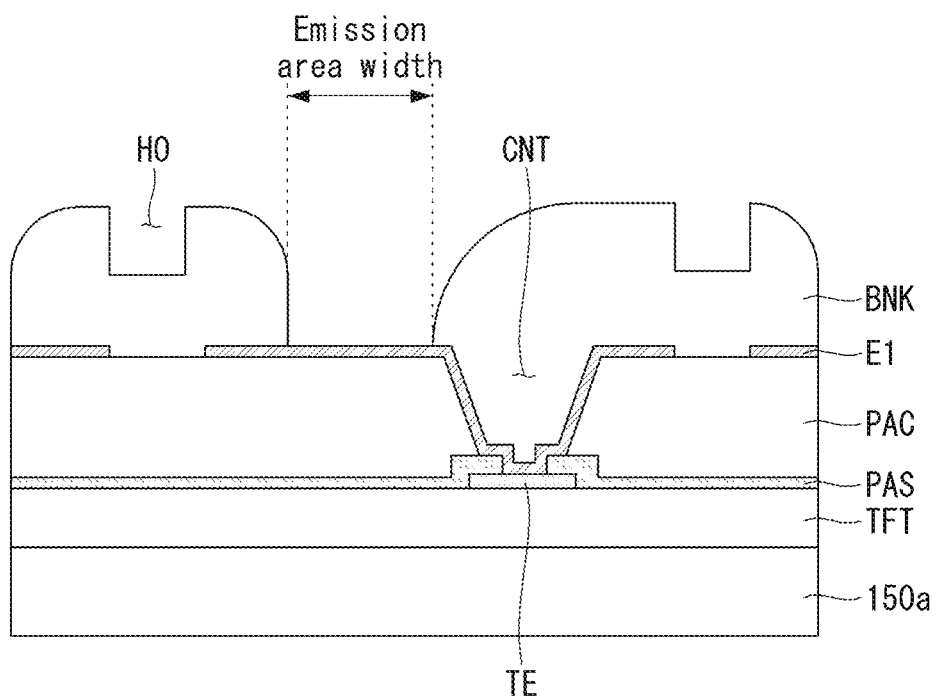
FIG. 8 is a diagram showing a cross section of the sub-pixel shown in FIG. 7 in a long-axis direction in more detail.

FIG. 6 is a diagram schematically showing a layout of sub-pixels according to an experimental example, FIG. 7 is a diagram showing a plane of a sub-pixel according to an experimental example in more detail and FIG. 8 is a diagram showing a cross section of the sub-pixel shown in FIG. 7 in a long-axis direction in more detail.

As shown in FIG. 6, first to fourth sub-pixels SP1 to SP4 according to the experimental example are arranged in a matrix form. The layout and formation of the sub-pixels are not limited thereto.

The first sub-pixels SP1 and the second sub-pixel SP2 may be defined as sub-pixels neighboring in the horizontal direction, the second sub-pixel SP2 and the fourth sub-pixel SP4 may be defined as sub-pixels neighboring in the vertical direction, and the third sub-pixel SP3 and the second sub-pixel SP2 may be defined as sub-pixels neighboring in a diagonal direction.

In the case of ultra-high definition products such as virtual reality (VR) devices, not high-definition products such as a TV receiver or a smartphone, a sub-pixel spacing is narrower. Here, the sub-pixel spacing includes vertical, horizontal and diagonal spacings.

As shown in the experimental example of FIGS. 7 and 8, an emission area EMA of a sub-pixel SPn is defined by a bank layer BNK. A contact hole CNT is formed adjacent to the emission area EMA. The inside and the surface of the contact hole CNT are covered by the band layer BNK.

The contact hole CNT is a region through which an electrode TE of a transistor TFT contacts (is electrically connected to) the lower electrode E1 of the organic light-emitting diode. The shown transistor TFT corresponds to a driving transistor for driving the organic light-emitting diode and the electrode TE corresponds to the source electrode or the drain electrode of the driving transistor.

The lower electrode E1 is positioned on a planarization layer PAC that covers a passivation layer PAS of the transistor TFT and electrically connected to the electrode TE of the transistor TFT. The lower electrode E1 is divided into a portion positioned on the sidewall of the planarization layer PAC (or a portion positioned in the contact) and a portion positioned on the surface of the planarization layer PAC (or a portion positioned in the emission area).

The bank layer BNK has the emission area EMA through which the lower electrode E1 is exposed and a bank hole HO recessed downward. The bank hole HO may have a rectangular (or square) shape surrounding the emission area EMA in a plan view but is not limited thereto.

The bank hole HO serves to isolate an emission layer (e.g., a layer that causes current leakage between sub-pixels, such as a charge generation layer) formed after the lower electrode E1 from other sub-pixels such that the emission layer exists only in each sub-pixel region without being connected to other sub-pixels. An organic material is selected to form the bank layer BNK to a specific height because the bank layer BNK needs to provide a height for forming the bank hole HO while defining the emission area EMA.

In the experimental example, a display panel is formed on the basis of the structure as shown in FIGS. 7 and 8 in order to realize a structure having a narrow sub-pixel spacing, such as ultra-high definition products. However, the experimental example should consider processing margin for forming the contact hole CNT and thus has difficulty in design change such as widening the aperture area. Accordingly, a life issue may be generated when ultra-high definition is realized.

First Embodiment

Figure 9:
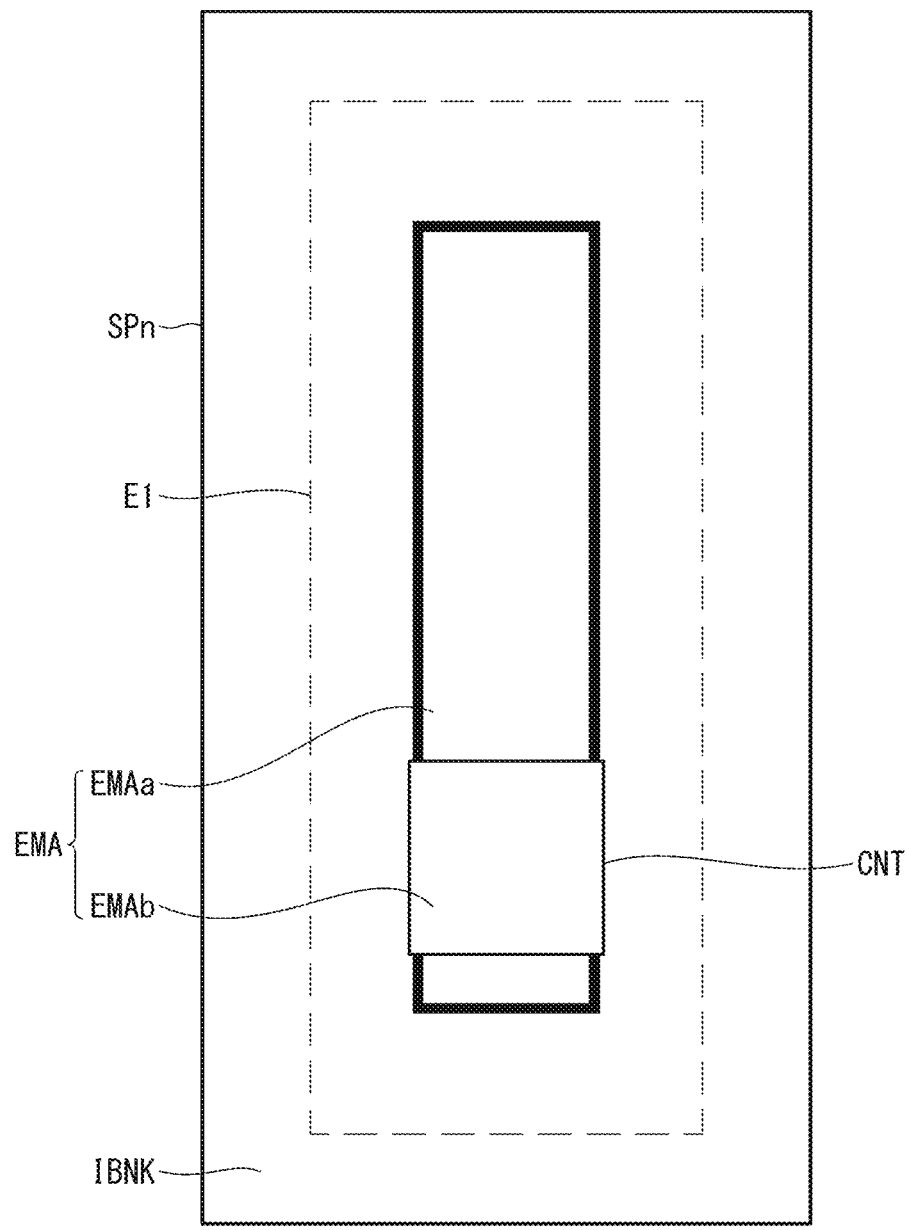
FIG. 9 is a diagram showing a plane of a sub-pixel according to a first embodiment of the present disclosure in more detail.
Figure 10:
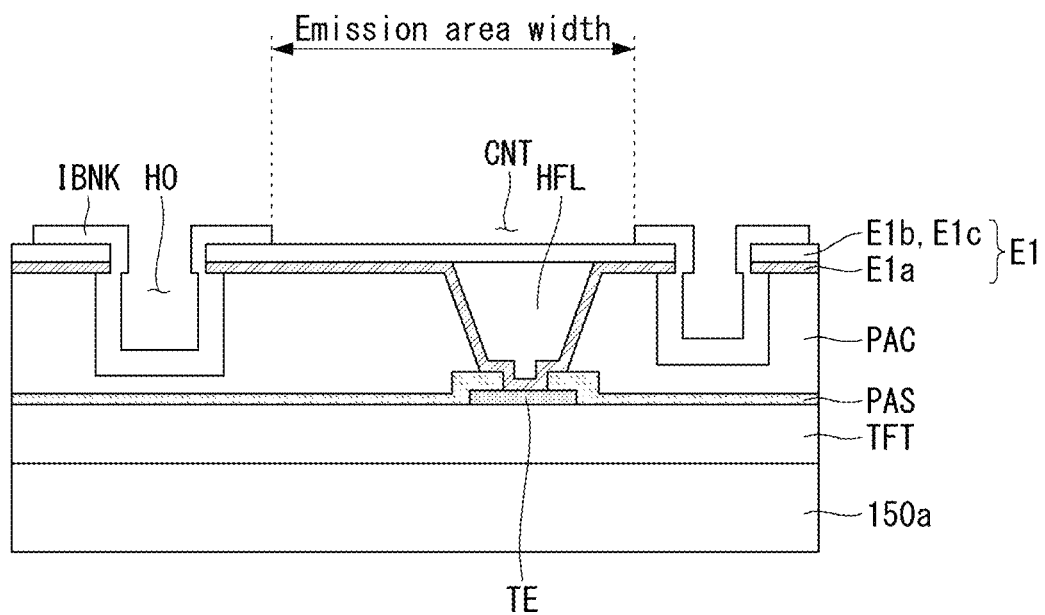
FIG. 10 is a diagram showing a cross section of the sub-pixel shown in FIG. 9 in a long-axis direction in more detail.
Figure 11:
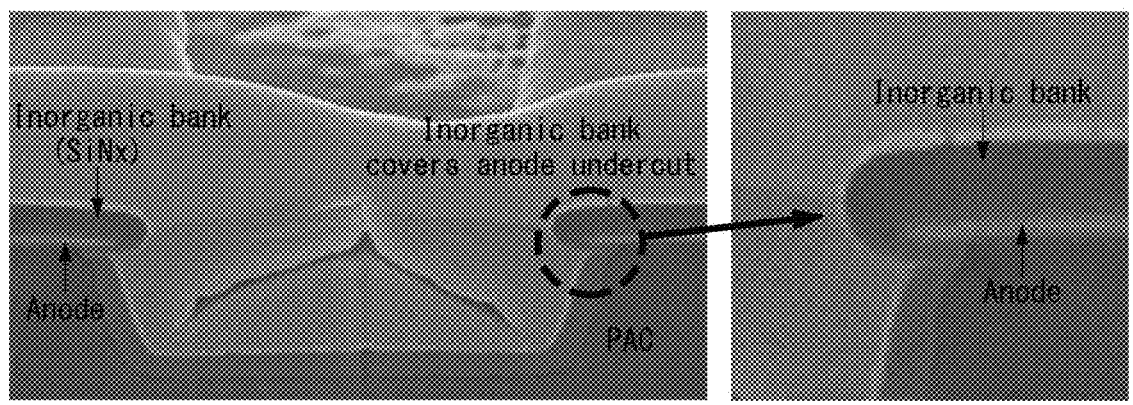
FIG. 11 is a picture showing an isolation hole of a planarization layer and structures surrounding the isolation hole.
Figure 12:
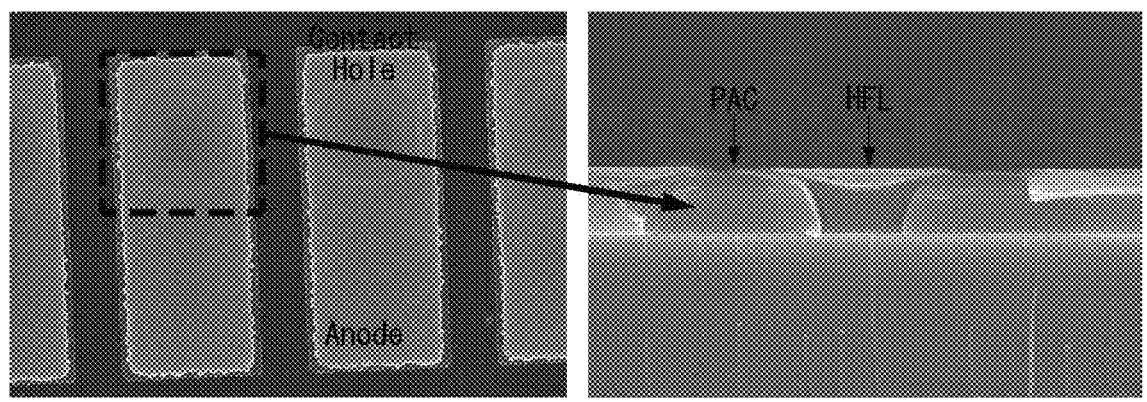
FIG. 12 is a picture showing sub-pixels having emission areas including contact holes and a hole-filling layer.

FIG. 9 is a diagram showing a plane of a sub-pixel according to a first embodiment of the present disclosure in more detail and FIG. 10 is a diagram showing a cross section of the sub-pixel shown in FIG. 9 in a long-axis direction in more detail. FIG. 11 is a picture showing an isolation hole of a planarization layer and structures surrounding the isolation hole and FIG. 12 is a picture showing sub-pixels having emission areas including contact holes and a hole-filling layer. The contact is the electrically conductive material inside the contact hole CNT.

According to the first embodiment illustrated in FIGS. 9 and 10, an emission area EMA of a sub-pixel SPn is defined by a bank layer BNK. A contact hole CNT is formed in the emission area EMA. The inside of the contact hole CNT is filled with a hole-filling layer HFL, thus creating the physical contact itself.

The contact hole CNT is a region through which an electrode TE of a transistor TFT contacts (is electrically connected to) a lower electrode E1 of an organic light-emitting diode. The shown transistor TFT corresponds to a driving transistor for driving the organic light-emitting diode and the electrode TE corresponds to the source electrode or the drain electrode of the driving transistor.

The lower electrode E1 is positioned on a planarization layer PAC that covers a passivation layer PAS of the transistor TFT and electrically connected to the electrode TE of the transistor TFT. The lower electrode E1 is composed of multiple layers. A first lower electrode E1a is divided into a portion positioned on the sidewall of the planarization layer PAC (or a portion positioned in the contact) and a portion positioned on the surface of the planarization layer PAC (or a portion positioned in the emission area).

Second and third lower electrodes E1b and E1c are positioned on the first lower electrode E1a and divided into a portion positioned on the first lower electrode E1a and a portion positioned on the hole-filling layer HFL. The first to third lower electrodes E1a, E1b and E1c may use the materials described with reference to FIG. 5 as materials thereof but the materials are not limited thereto. In addition, although the two layers of the second and third lower electrodes E1b and E1c are formed on the first lower electrode E1a in the first embodiment, a single layer may be formed on the first lower electrode E1a.

As the contact is formed in the emission area EMA, the emission area EMA is divided into a first emission area EMAa and a second emission area EMAb. The first emission area EMAa corresponds to an area exposed through the bank layer BNK. The second emission area EMAb corresponds to an area occupied by the contact or the hole-filling layer HFL. An emission layer and an upper electrode are formed in the first emission area EMAa and the second emission area EMAb through a process described below. The areas emit light in the same color.

The planarization layer PAC has an isolation hole HO recessed downward along with the contact hole CNT. The isolation hole HO may have a rectangular (or square) shape surrounding the emission area EMA in a plan view but is not limited thereto. Since the sub-pixel and the emission area may have various shapes and the isolation hole HO may correspond to such shapes, the isolation hole is not limited to a rectangular (or square) shape.

The isolation hole HO serves to isolate an emission layer (e.g., a layer that causes current leakage between sub-pixels, such as a charge generation layer) formed after the lower electrode E1 from other sub-pixels such that the emission layer exists only in each sub-pixel region without being connected to other sub-pixels. That is, the isolation hole HO serves as the bank hole HO in the experimental example.

A bank layer IBANK is formed around the isolation hole HO to cover part of the lower electrode E1. Although the bank layer IBNK defines the emission area EMA, the bank layer IBNK is formed of an inorganic material because it need not provide a height for forming a hole, distinguished from the experimental example.

When the structure according to the first embodiment is used, processing margin for forming the contact hole CNT need not be considered because a region for forming the emission area EMA and a region for forming the contact hole CNT can be arranged within the same space, that is, space loss due to separation of the emission area EMA from the control hole CNT can be eliminated.

In addition, when the structure according to the first embodiment is used, the emission area EMA and the contact are integrated and light can be emitted from the emission layer on the contact in the emission area EMA and thus the aperture ratio increases. Consequently, the first embodiment can solve the problem (life issue) in the experimental example when ultra-high definition is realized and has advantages in a manufacturing process.

Furthermore, when the structure according to the first embodiment is used, the contact EMA can be freely configured and arranged in the emission area EMA without being limited in size and shape. Consequently, contact resistance between the electrode TE of the transistor TFT and the lower electrode E1 can be reduced.

Cross sections of a sub-pixel structure manufactured according to the first embodiment are shown in FIGS. 11 and 12. In FIG. 11, PAC corresponds to the planarization layer, "Anode" corresponds to the lower electrode, and "Inorganic bank" corresponds to the bank layer. In FIG. 12, "Contact hole" corresponds to the contact hole and HFL corresponds to the hole-filling layer. Namely, the hole is the opening in the PAC layer that is the contact hole and the final structure that conducts electricity, after being filled with the HFL is the contact.

Hereinafter, a method of manufacturing an organic light-emitting display device according to the first embodiment of the present disclosure will be described. In the manufacturing method described below, a transistor part is schematically illustrated because various structures of a lower part of a transistor can be selected according to transistor type or manufacturing method, and structures formed after the transistor part are illustrated and described in detail.

FIGS. 13 to 24 are cross-sectional views for describing the method of manufacturing an organic light-emitting display device according to the first embodiment of the present disclosure.

Figure 13:
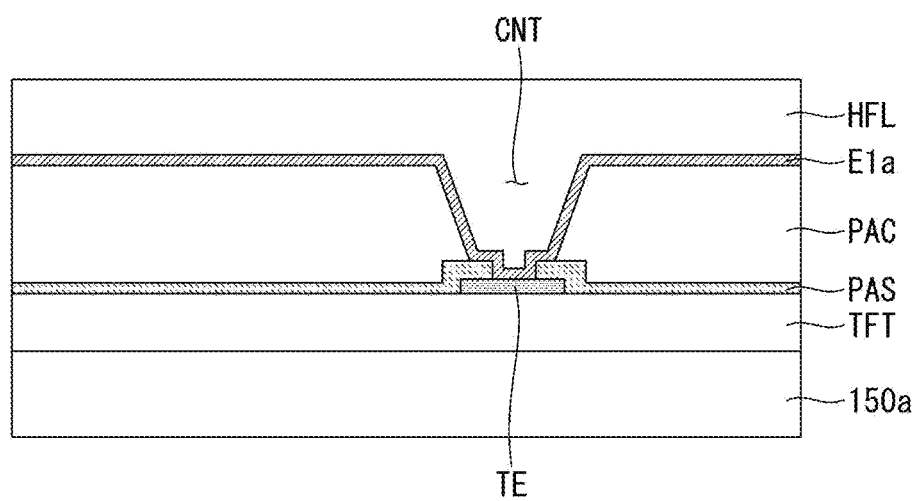
FIGS. 13 to 24 are cross-sectional views for describing a method of manufacturing an organic light-emitting display device according to the first embodiment of the present disclosure.

As shown in FIG. 13, a transistor TFT having a gate electrode, a source electrode and a drain electrode are formed on a first substrate 150a. A passivation layer PAS is formed on the first substrate 150a to cover the transistor TFT.

A planarization layer PAC is formed on the first substrate 150a to cover the passivation layer PAS. An organic material is selected to form the planarization layer PAC. The passivation layer PAS and the planarization layer PAC are patterned to expose an electrode TE of the transistor TFT. The portion of the planarization layer PAC through which the electrode TE of the transistor TFT is exposed corresponds to a contact hole CNT. The contact hole CNT may be formed in various shapes such as a circle, an oval and a square.

A first lower electrode E1a is formed on the planarization layer PAC by performing a first electrode process (process for forming a first lower electrode). A hole-filling layer HFL is formed on the planarization layer PAC. An organic material is selected to form the hole-filling layer HFL and thus the hole-filling layer HFL is formed to a specific thickness on the planarization layer PAC while filling the contact hole CNT.

Figure 14:
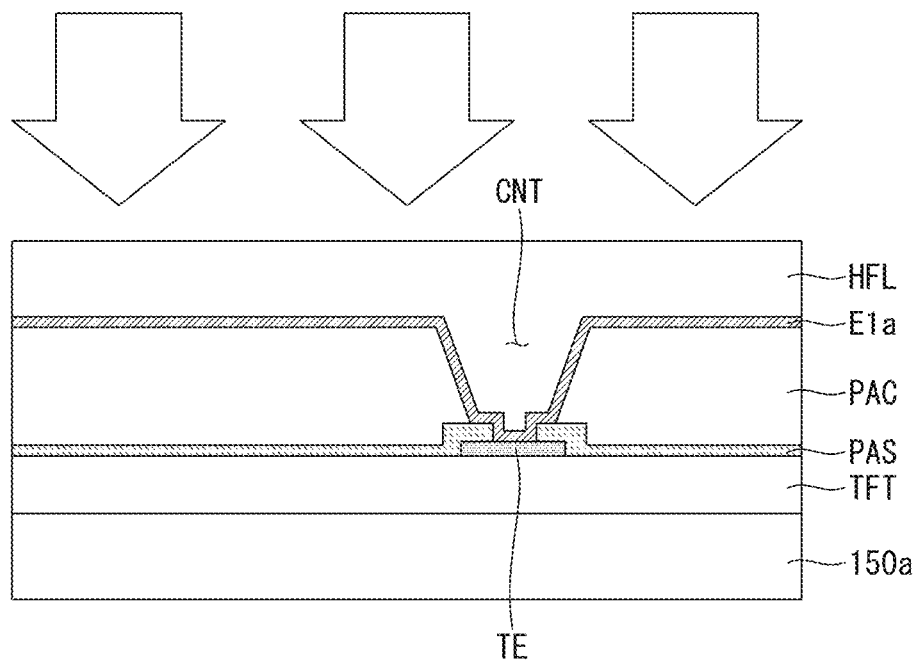
Figure 15:
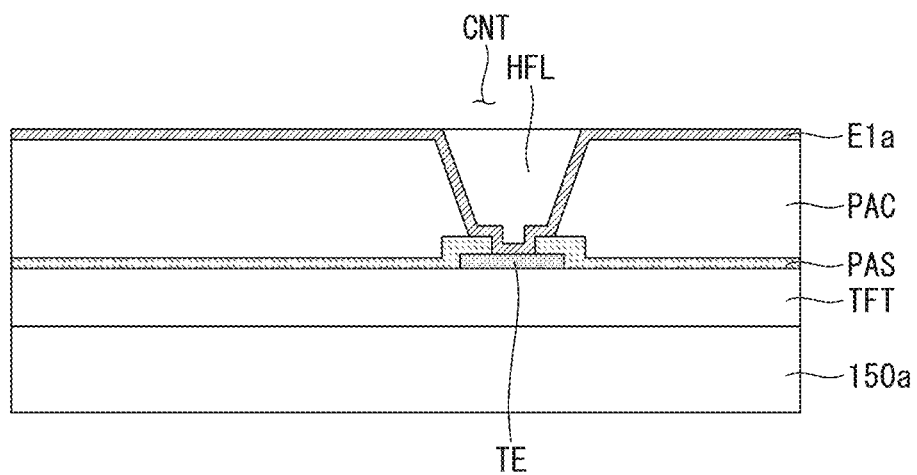

The entire surface of the first substrate 150 is exposed, as shown in FIG. 14, and then developed and cured, as shown in FIG. 15, to remove the hole-filling layer HFL remaining on the planarization layer PAC. Accordingly, the hole-filling layer HFL remains only in the contact hole CNT. Here, the hole-filling layer HFL has a height similar or identical to the first lower electrode E1a.

Figure 16:
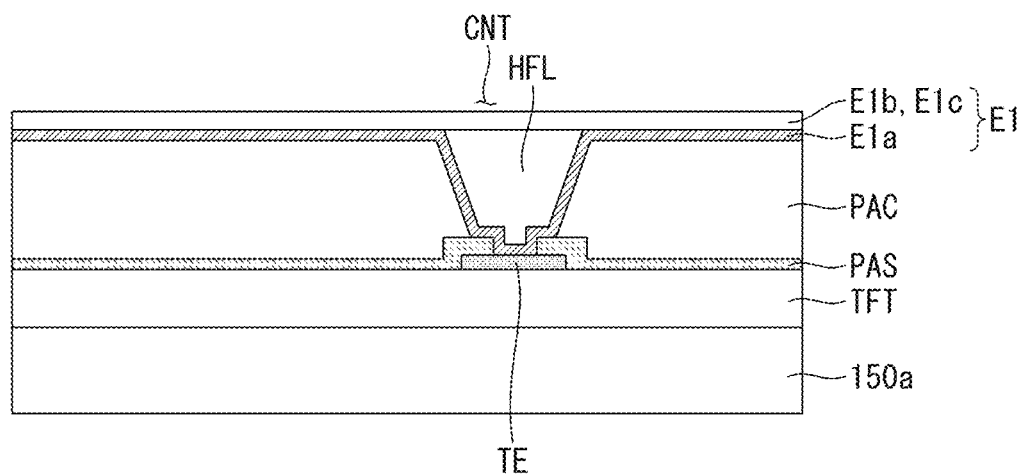

As shown in FIG. 16, second and third lower electrodes E1b and E1c are formed on the first lower electrode E1a by performing a second electrode process (process for forming a second lower electrode). Although the first lower electrode E1a is formed as a single layer through the first electrode process and the second and third lower electrodes are formed as multiple layers through the second electrode process, the present disclosure is not limited thereto. That is, both the first and second electrode processes may form a single-layer electrode.

Figure 17:
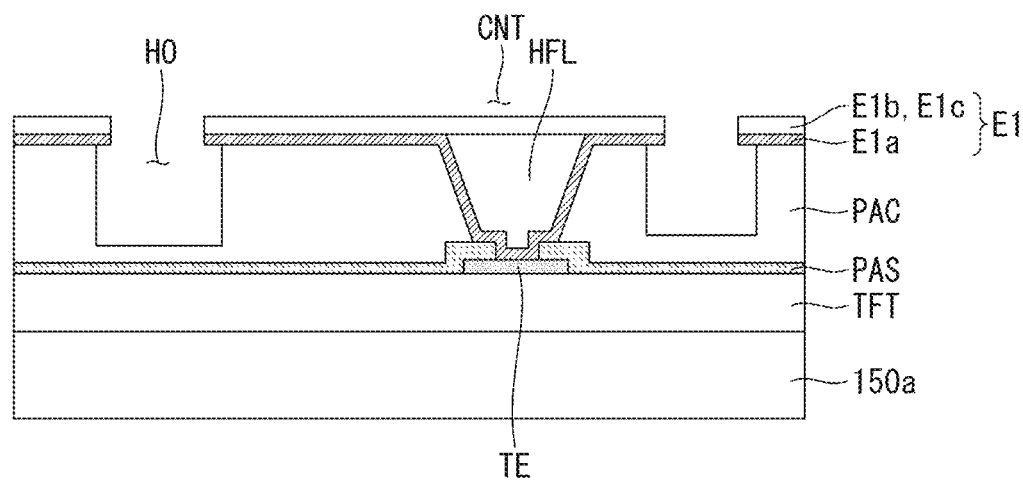

As shown in FIG. 17, an isolation hole HO is formed in the planarization layer PAC. The isolation hole HO provides a space recessed downward in the planarization layer PAC. The first to third lower electrodes E1a to E1c are patterned to be isolated per region defined as a sub-pixel by the isolation hole HO formed in the planarization layer PAC. That is, the lower electrode formed on the surface of the planarization layer PAC is isolated per sub-pixel by the isolation hole HO.

Figure 18:
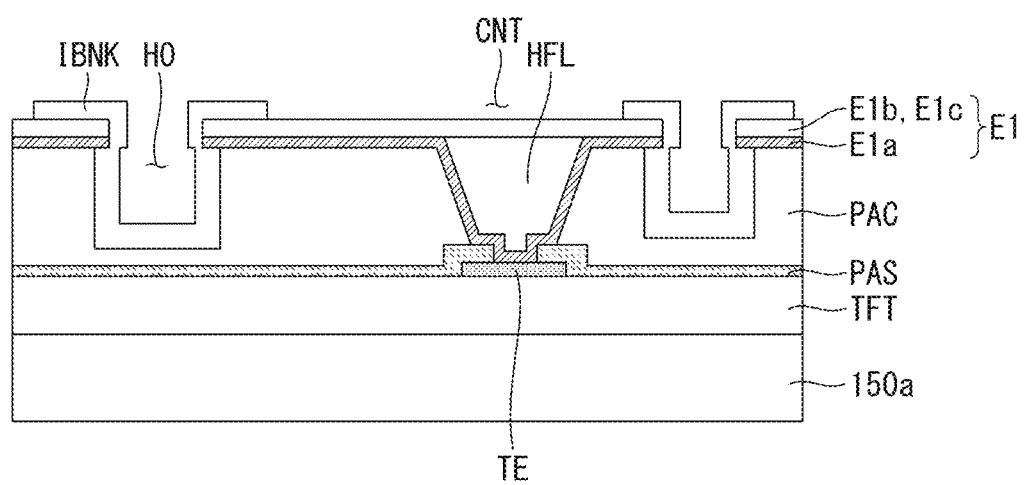

As shown in FIG. 18, a bank layer IBNK is formed on the third lower electrode E1c (or the second lower electrode). An inorganic material may be selected to form the bank layer IBNK. The bank layer IBNK is formed to cover only part of the third lower electrode E1c formed on the inner side of the isolation hole HO and a surrounding region of the isolation hole HO.

The process of forming the isolation hole HO and the bank layer IBNK will be described in more detail with reference to FIGS. 19 to 24.

Figure 19:
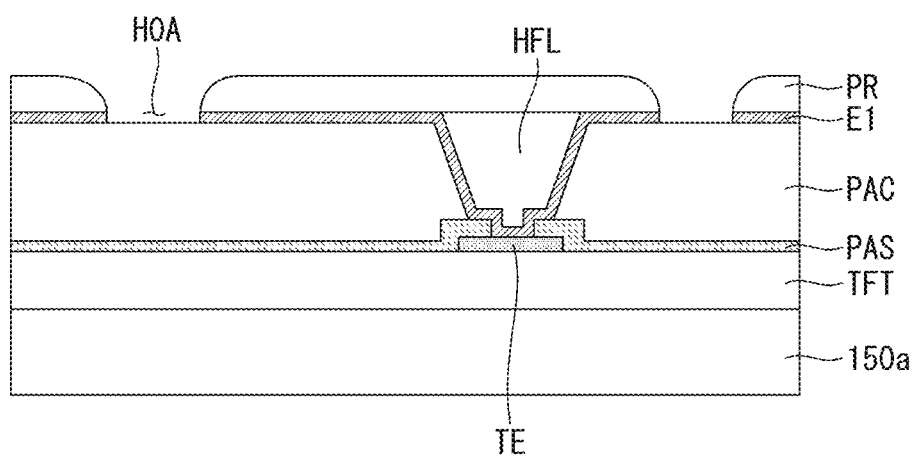

As shown in FIG. 19, an isolation hole area HOA to be used as an isolation hole is defined on the lower electrode E1. A photoresist PR is coated on the lower electrode E1 and patterned to expose the defined isolation hole area HOA. Then, wet etch is performed to selectively remove the lower electrode E1. When wet etch is performed, a portion of the lower electrode E1, exposed through the photoresist pattern PR, is removed. As a result, the planarization layer PAC formed under the lower electrode E1 is exposed.

Figure 20:
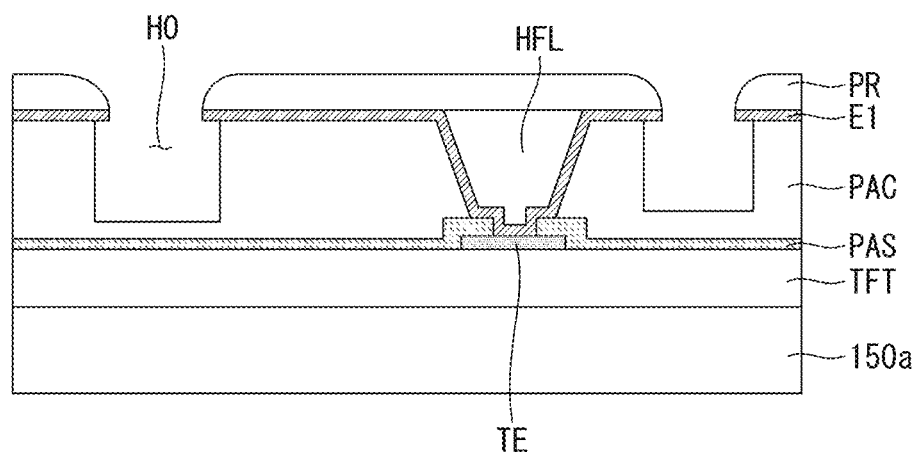

As shown in FIG. 20, dry etch is performed in order to selectively remove the planarization layer PAC. When dry etch is performed, a portion of the planarization layer PAC, exposed through the photoresist pattern PR, is removed. As a result, the isolation hole HO recessed downward is formed in the planarization layer PAC.

Figure 21:
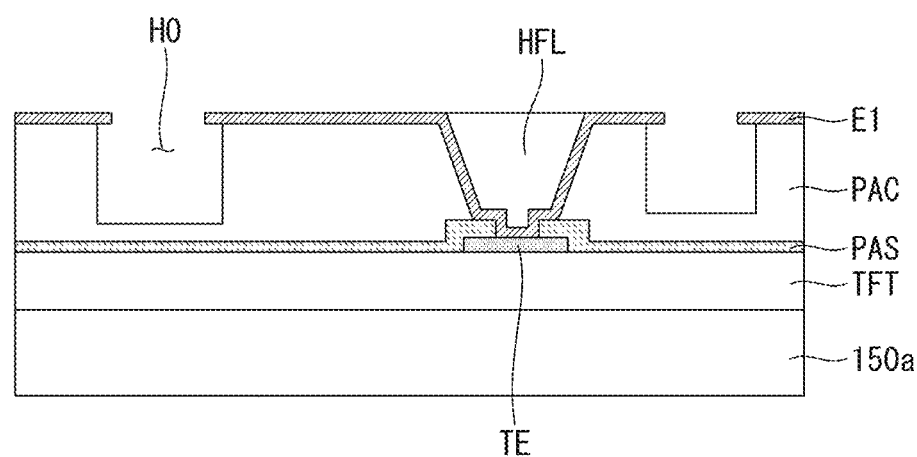

As shown in FIG. 21, the photoresist pattern PR is removed after the isolation hole HO is formed. As a result, the isolation hole HO recessed downward is formed in the planarization layer PAC and the lower electrode E1.

Figure 22:
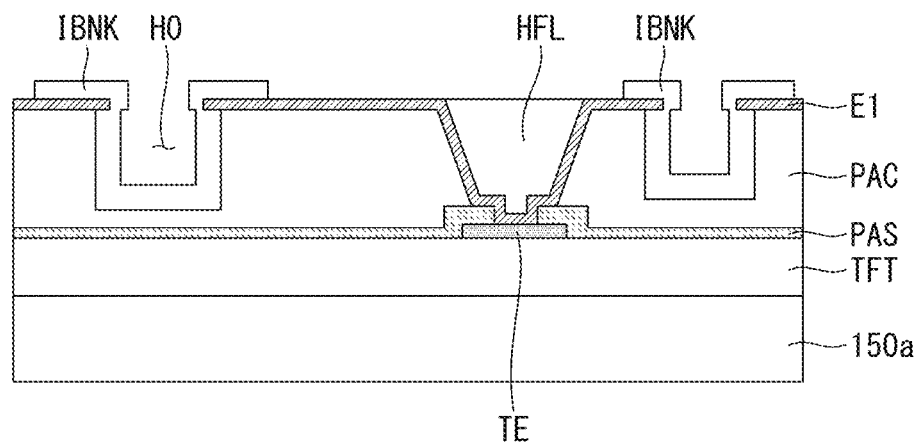

As shown in FIG. 22, the bank layer IBNK is formed on the lower electrode E1. A portion of the bank layer IBNK other than the portion corresponding to the isolation hole HO is removed through a patterning process. Consequently, the bank layer IBNK covers the inner side of the isolation hole HO and only part of the lower electrode E1 which corresponds to a surrounding region of the isolation hole HO.

Figure 23:
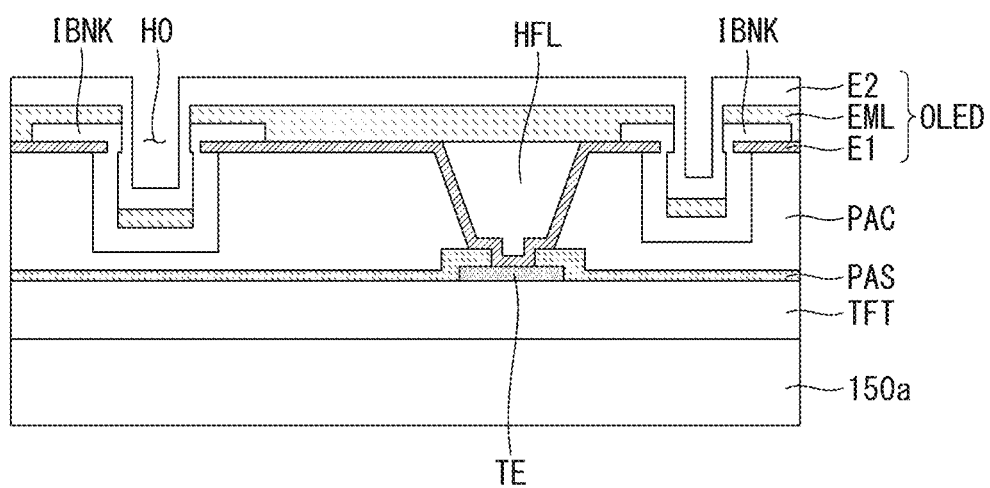

As shown in FIG. 23, an emission layer EML and an upper electrode E2 are formed on the lower electrode E1. The emission layer EML and the upper electrode E2 may be formed through a deposition process on the basis of a mask (common mask) for exposing a display area. Through this process, an organic light-emitting diode OLED including the lower electrode E1, the emission layer EML and the upper electrode E2 is formed.

Figure 24:
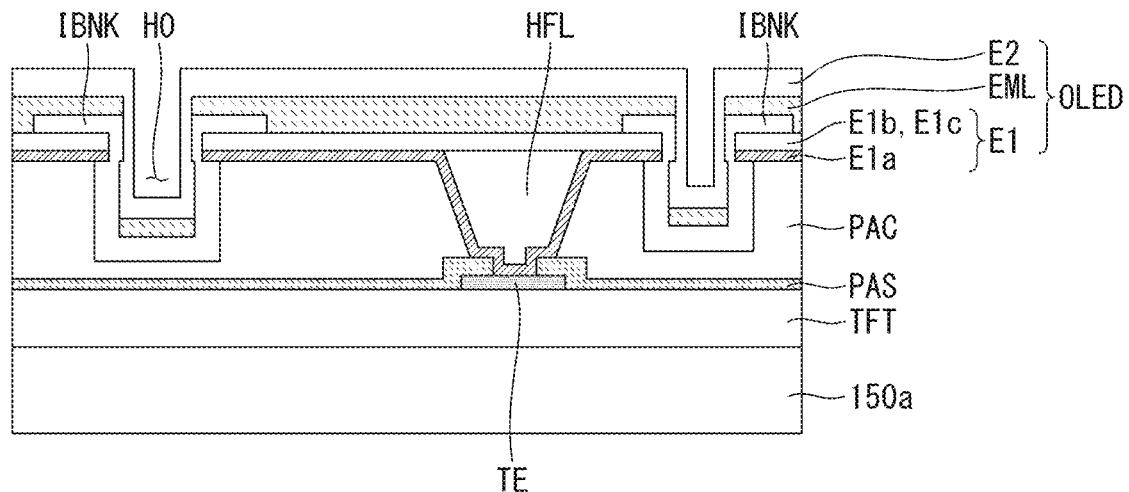
Figure 25:
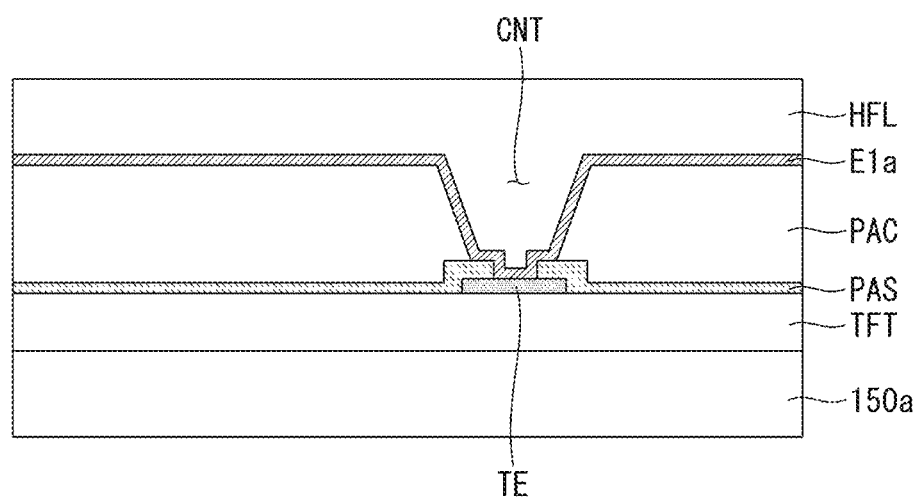
FIGS. 25 to 28 are diagrams for describing structures of a hole-filling layer according to a second embodiment.
Figure 26:
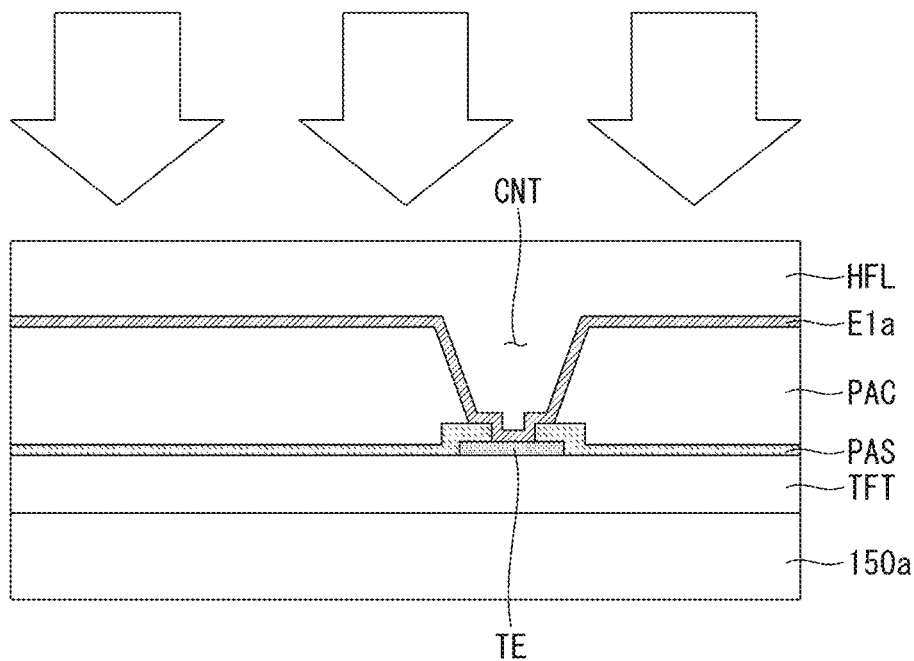
Figure 27:
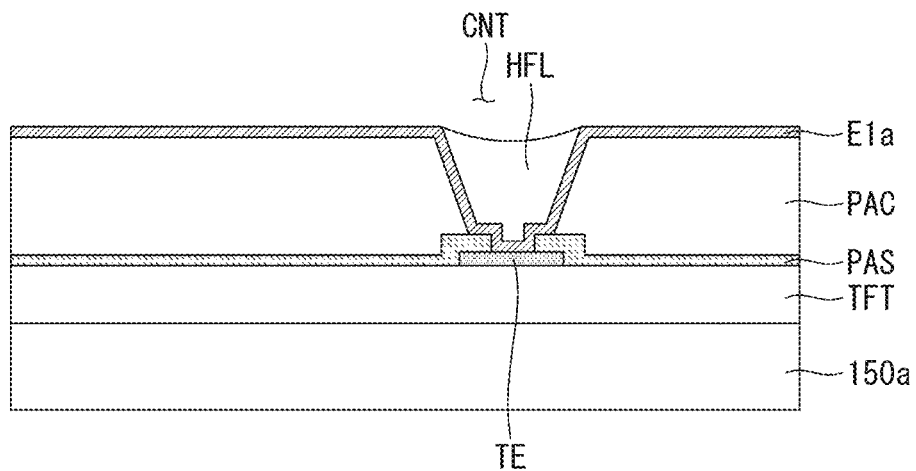
Figure 28:
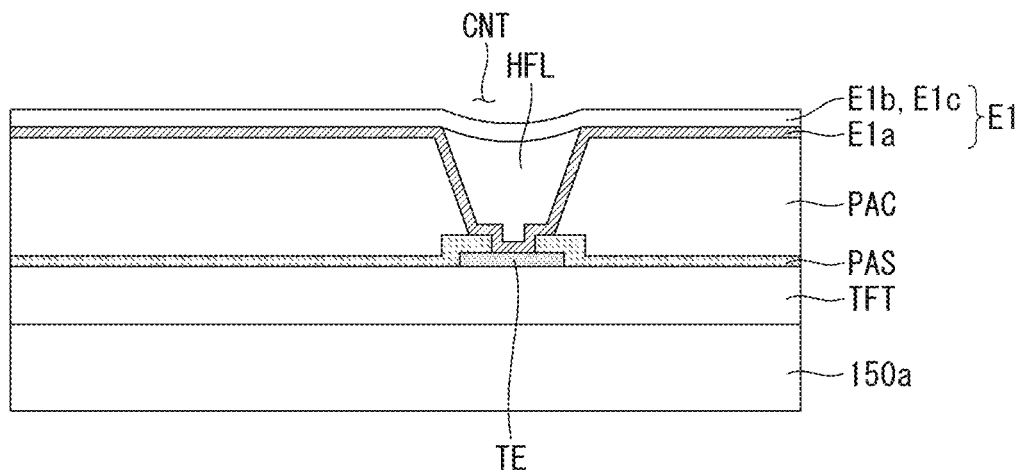

As shown in FIG. 24, the emission layer EML and the upper electrode E2 are formed on the lower electrode E1. Although the upper electrode E2 is formed to cover the entire display area, the emission layer EML may be formed in the following structures using the isolation hole HO.

(1) The emission layer EML is formed having the same thickness in the entire area of the sub-pixels (including the emission area and the non-emission area) but is isolated by the isolation hole HO. (2) The emission layer EML is formed having the same thickness in the entire area of the sub-pixels but has a relatively thin portion and an isolated portion in the isolation hole HO. (3) The emission layer EML is formed having the same thickness in the entire area of the sub-pixels but is relatively thin only in the isolation hole HO (particularly, a portion of the emission layer formed on the sidewall of the isolation hole is thinnest).

As described, the emission layer EML is formed in the structures (1), (2) and (3) due to pattern structures of the isolation hole HO, the bank layer IBNK and the lower electrode E1. This will be described below in detail. The following description is based on the first embodiment and thus only features distinguished from the first embodiment will be described and other parts will be omitted. Refer to the first embodiment for the omitted parts.

Second Embodiment

Figure 29:
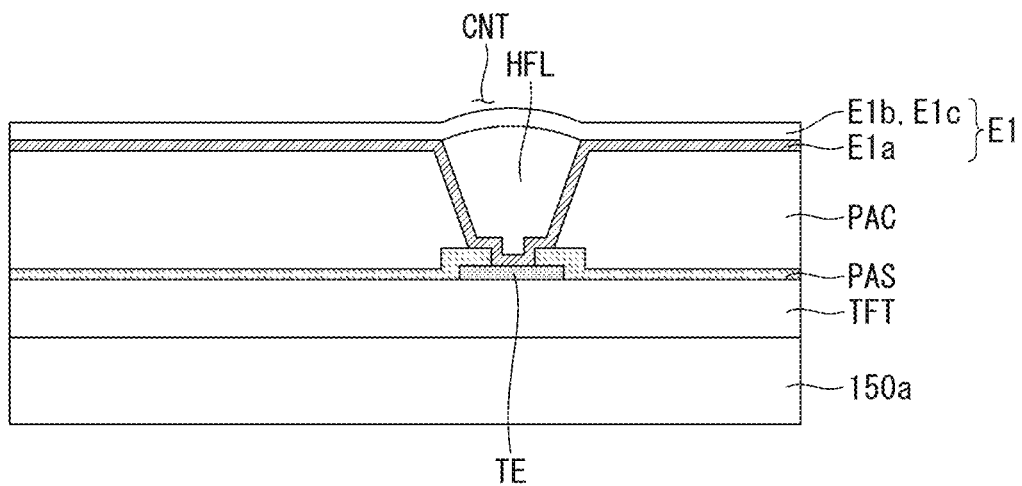
FIG. 29 is a diagram for describing a structure of a hole-filling layer according to a modified example of the second embodiment.

FIGS. 25 to 28 are diagrams for describing structures of the hole-filling layer according to a second embodiment and FIG. 29 is a diagram for describing a structure of the hole-filling layer according to a modified example of the second embodiment.

According to the second embodiment illustrated in FIGS. 25 to 28, the hole-filling layer HFL may be formed to be further recessed downward (in the form of a concave lens) without having a thickness similar or identical to that of the first lower electrode E1 by varying exposure, developing and curing process conditions.

According to the modified example of the second embodiment illustrated in FIG. 29, the hole-filling layer HFL may be formed to protrude upward (in the form of a convex lens) without having a thickness similar or identical to that of the first lower electrode E1 by varying exposure, developing and curing process conditions.

As described above, the hole-filling layer HFL is formed in the aforementioned shapes by varying process conditions. Meanwhile, the most ideal structure of the hole-filling layer HFL is having a thickness similar or identical to that of the first lower electrode E1a.

However, when the structures of the second embodiment described above are used, the quantity of light emitted in the horizontal/vertical directions can be increased. Accordingly, it is possible to increase the life of the display device and vertical/horizontal viewing angles according to emission area increase.

Third Embodiment

Figure 30:
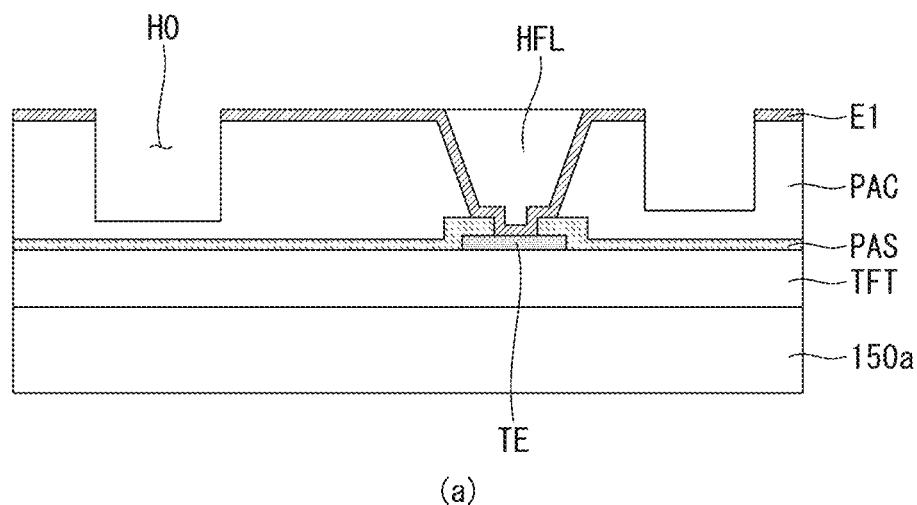
FIG. 30 is a diagram for describing structures of an isolation hole and a lower electrode according to a third embodiment.
Figure 30:
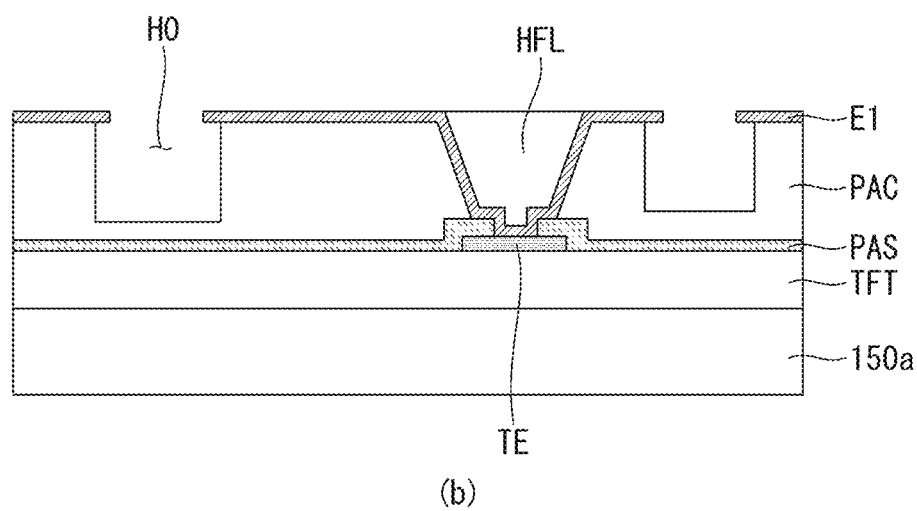

FIG. 30 is a diagram for describing structures of the isolation hole and the lower electrode according to a third embodiment.

According to the third embodiment illustrated in FIG. 30, the isolation hole HO and the lower electrode E1 may be formed in (1) a structure in which the boundary of the isolation hole HO corresponds to the boundary of the lower electrode E1 ((a) of FIG. 30) or (2) a structure in which the boundary of the lower electrode E1 protrudes from the boundary of the isolation hole HO ((b) of FIG. 30).

It is desirable to form the isolation hole HO and the lower electrode E1 such that the planarization layer PAC is recessed from the boundary of the lower electrode E1 (which may be referred to as a mushroom or undercut) as shown in FIG. 30(b) because it is known that the above-described structure can further improve isolation of the emission layer from experimental results.

Fourth Embodiment

Figure 31:
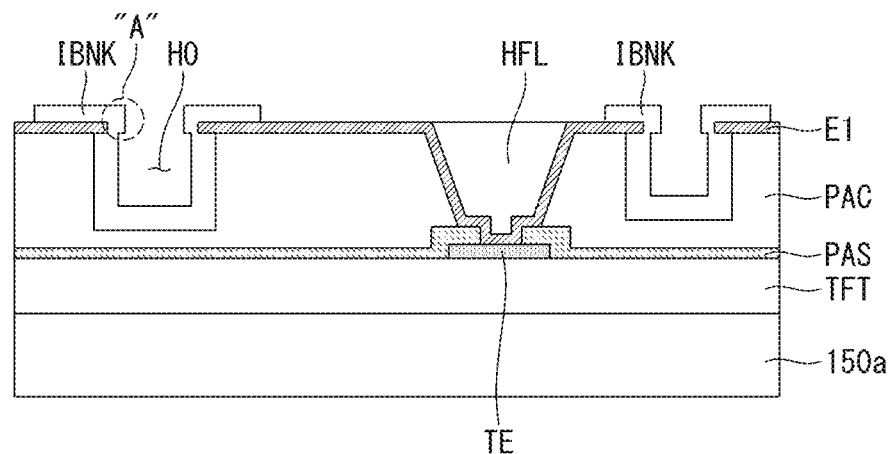
FIG. 31 is a diagram for describing structures of a bank layer according to a fourth embodiment.
Figure 31:
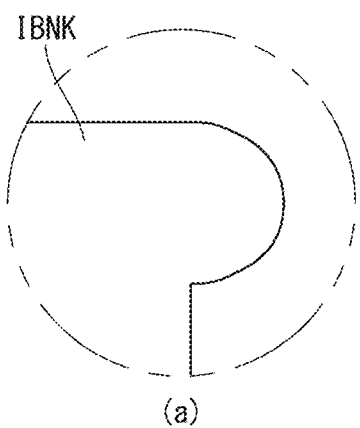
Figure 31:
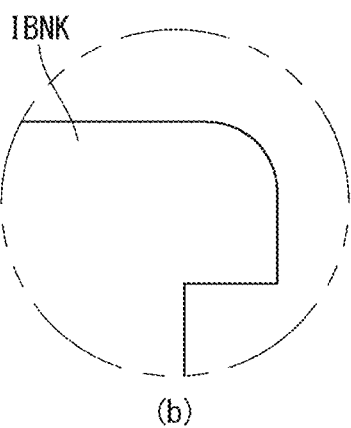
Figure 31:
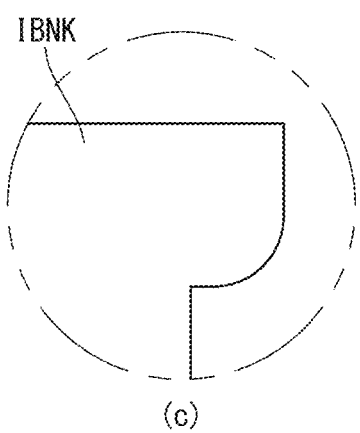
Figure 31:
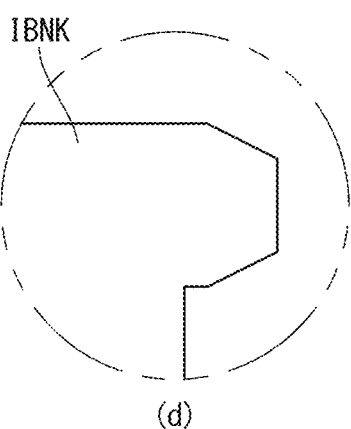

FIG. 31 is a diagram for describing a bank layer structure according to a fourth embodiment.

As shown in enlarged views of a portion "A" in FIG. 31, the bank layer IBNK may be formed in (1) a structure in which upper and lower edges of a portion of the bank layer IBNK adjacent to the boundary of the isolation hole HO are rounded ((a) of FIG. 31), (2) a structure in which the upper or lower edge of the portion of the bank layer IBNK adjacent to the boundary of the isolation hole HO is rounded ((b) and (c) of FIG. 31) and (3) a structure in which the upper and lower edges of the portion of the bank layer IBNK adjacent to the boundary of the isolation hole HO are angulated ((d) of FIG. 31).

The boundary of the bank layer IBNK may correspond to the boundary of the isolation hole HO or may protrude from the boundary of the isolation hole HO although it depends on the structure of the lower electrode E1. In addition, the portion of the bank layer IBNK adjacent to the boundary of the isolation hole HO may have the structures as shown in FIG. 31. According to experimental results, isolation of the emission layer can be further improved when the bank layer IBNK is formed in the structures as shown in FIG. 31.

As described above, the present disclosure can eliminate space loss by arranging a contact from which light can be emitted in an emission area and increase the aperture ratio by arranging the emission area and the contact in an integrated manner. In addition, the present disclosure can increase the life of the display device as well as the aperture ratio since light can be emitted through the contact in the emission area. Furthermore, the present disclosure can freely configure and arrange the contact in the emission area to reduce contact resistance between electrodes and to increase a degree of freedom of design.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A light-emitting display device, comprising:
a first substrate;
sub-pixels positioned on the first substrate and having emission areas from which light is emitted; and
a contact positioned in each emission area and serving to electrically connect a transistor of each sub-pixel to a light-emitting diode that emits light,
wherein an emission layer on the contact emits light of the same color as light emitted from the emission area,
wherein each of the sub-pixels includes:
a transistor on the first substrate;
a passivation layer positioned on the transistor;
a planarization layer positioned on the passivation layer, and exposing an electrode of the transistor and having the contact positioned in the emission area,
a hole-filling layer filling the inside of the contact hole;
a second lower electrode positioned on the first lower electrode and the hole-filling layer;
the emission layer positioned on the second lower electrode; and
an upper electrode positioned on the emission layer.

2. The light-emitting display device according to claim 1, wherein the contact includes a hole-filling layer filling the recessed inside thereof.

3. The light-emitting display device according to claim 1, further comprising:
a lower electrode positioned on the contact;
the emission layer positioned on the lower electrode; and
an upper electrode positioned on the emission layer.

4. The light-emitting display device according to claim 1, wherein the planarization layer includes an isolation hole surrounding the emission area and recessed downward.

5. The light-emitting display device according to claim 4, wherein the first and second lower electrodes are isolated per sub-pixel by the isolation hole.

6. The light-emitting display device according to claim 4, wherein the emission layer is formed having the same thickness in the entire area of the sub-pixels and is isolated in the isolation hole.

7. The light-emitting display device according to claim 4, wherein the emission layer is formed having the same thickness in the entire area of the sub-pixels and includes a relatively thin portion and an isolated portion in the isolation hole.

8. The light-emitting display device according to claim 4, wherein the emission layer is formed having the same thickness in the entire area of the sub-pixels and is relatively thin only in the isolation hole.

9. The light-emitting display device according to claim 4, further comprising a bank layer covering part of the lower electrode around the isolation hole.

10. The light-emitting display device according to claim 9, wherein the bank layer covers part of the lower electrode positioned inside the isolation hole and a surrounding region of the isolation hole.

11. The light-emitting display device according to claim 9, wherein the bank layer has rounded or angulated edges at the boundary of the isolation hole.

12. The light-emitting display device according to claim 1, wherein the hole-filling layer has a thickness similar or identical to the first lower electrode.

13. The light-emitting display device according to claim 1, wherein the hole-filling layer is recessed downward from the first lower electrode.

14. The light-emitting display device according to claim 1, wherein the hole-filling layer protrude upward from the first lower electrode.

* * * * *